(12) United States Patent
Nagashima

(10) Patent No.: US 7,655,965 B2
(45) Date of Patent: Feb. 2, 2010

(54) SEMICONDUCTOR LIGHT RECEIVING DEVICE AND METHOD OF MANUFACTURING THE SAME

(75) Inventor: Nobuyuki Nagashima, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 277 days.

(21) Appl. No.: 11/393,789

(22) Filed: Mar. 31, 2006

(65) Prior Publication Data

US 2006/0220079 A1 Oct. 5, 2006

(30) Foreign Application Priority Data

Mar. 31, 2005 (JP) ............... 2005-102836

(51) Int. Cl.
*H01L 31/113* (2006.01)
(52) U.S. Cl. ............. 257/292; 257/233; 257/431; 257/466; 257/E27.129; 257/E27.03; 257/E31.039; 257/E31.038; 257/E27.133
(58) Field of Classification Search ........... 257/292, 257/233, 431, 466, E27.129, E31.039, E31.038, 257/E27.133, E27.03
See application file for complete search history.

(56) References Cited

U.S. PATENT DOCUMENTS

| 5,101,253 | A | * | 3/1992 | Mizutani et al. ............ 257/414 |
| 6,111,299 | A | | 8/2000 | Dabrowski et al. |
| 6,114,740 | A | * | 9/2000 | Takimoto et al. ............ 257/461 |
| 6,433,374 | B1 | * | 8/2002 | Fukunaga et al. ............ 257/292 |
| 6,809,391 | B1 | * | 10/2004 | Koiwa ........................ 257/465 |
| 2002/0050593 | A1 | | 5/2002 | Fukunaga et al. |

FOREIGN PATENT DOCUMENTS

| EP | 0 501 316 A | 9/1992 |
| EP | 1 017 105 A | 7/2000 |
| JP | 9-283787 | 10/1997 |
| JP | 2000-223735 | 8/2000 |
| JP | 2002-100060 | 4/2002 |
| JP | 2002-203954 | 7/2002 |

* cited by examiner

*Primary Examiner*—Wai-Sing Louie
*Assistant Examiner*—Marc Armand
(74) *Attorney, Agent, or Firm*—Young & Thompson

(57) ABSTRACT

A semiconductor light receiving device includes a plurality of photodiode units, each of which is configured to convert a received light into an electric signal; and a separating unit configured to electrically separates the plurality of photodiode units from each other. The impurity concentration of a surface portion of the separating unit is equal to or lower than a first concentration. The first concentration is a concentration at which the light receiving sensitivity of the separating unit to light is substantially equal to the light receiving sensitivity of each of the plurality of photodiode units of the light. A wavelength of the light is equal to or longer than that of blue-violet light.

9 Claims, 8 Drawing Sheets

SEMICONDUCTOR LIGHT RECEIVING DEVICE AND METHOD OF MANUFACTURING THE SAME

BACKGROUND OF THE INVENTION

1. Field of the Invention

The present invention relates to a semiconductor light receiving device and a method of manufacturing the same. More particularly, the present invention relates to a semiconductor light receiving device whose light receiving property is improved, and a method of manufacturing the same.

2. Description of the Related Art

A semiconductor light receiving device is known for converting a received light into an electric signal. For example, FIG. 1 is a sectional view showing a configuration of a conventional semiconductor light receiving device.

A conventional semiconductor light receiving device 101 includes: a photodiode unit 102 for converting a received light into an electric signal; and a circuit unit 103 for reading an output of the photodiode unit 102. The manufacturing method is as follows. At first, an n+ type embedding layer 112 is formed in the region of the circuit unit 103 on a p− type substrate 110. After that, so as to cover the entire p− type substrate 110, an n type epitaxial layer 113 is grown. In succession, p+ type embedded layers 104 are diffused at predetermined positions from surface. After that, with the addition of a thermal processing step, the p+ type embedded layers 104 are penetrated to the p-substrate 110. Consequently, the region in the photodiode unit 102 is divided, and the photodiode unit 102 and the circuit unit 103 are insulated and separated. Then, a pn-junction photodiode of the p− type substrate 110 and the n type epitaxial layer 113 is configured. Moreover, a n+ type diffusion layer 105 is formed on the surface of the n type epitaxial layer 113 to obtain a low resistance region. Then, a collector pulling unit 106, a base unit 107 and an emitter unit 108 of the circuit section 103 are sequentially formed to complete the semiconductor light receiving device 101.

In the configuration of the conventional semiconductor light receiving device and the method of manufacturing the same, for the sake of the division of the region in the photodiode unit 102 and the insulation and separation between the photodiode unit 102 and the circuit unit 103, the p+ type embedded layer 104 is diffused at a high concentration from the surface, and the thermal process is then performed at a high temperature. Consequently, the p+ type embedded layer 104 penetrates from the surface to the p− semiconductor substrate 110. Thus, the portion close to the surface of the separating unit (the p+ type embedded layer 104) for the sake of the insulation and separation is formed at the high concentration.

FIG. 2 is a graph showing the concentration profile in the depth direction in the photodiode separating unit (the p+ type embedded layer 104) of the semiconductor light receiving device. The longitudinal axis shows the impurity concentration, and the lateral axis shows the diffusion depth, respectively. With reference to FIG. 2, the highest surface has the highest concentration, and the concentration becomes lower as the depth becomes deeper. Thus, in the conventional semiconductor light receiving device 101, when a blue-violet laser light 109 whose oscillation wavelength (405 nm) is short is emitted to the surface of the photodiode unit 102, the absorption length of light becomes shallow such as 0.1 μm. Thus, the recombination of carries generated in the surface vicinity is great, which results in the drop in the light receiving sensitivity of the photodiode unit 102.

FIG. 3 is a graph showing the light receiving sensitivity in the vicinity of the photodiode separating unit (the p+ type embedded layer 104). The longitudinal axis shows the light receiving sensitivity (arbitrary unit). The lateral axis shows a position where blue-violet laser light is emitted, with the photodiode separating unit (the p+ type embedded layer 104) as the center. As shown in FIG. 1, when the blue-violet laser light 109 is emitted, the range shown by "B'" indicates the light receiving sensitivity of the photodiode separating unit (the p+ type embedded layer 104). That is, it is known that the photodiode separating unit (the p+ type embedded layer 104) has the drop in the light receiving sensitivity indicated as a difference "C'". This is the drop of about 40%, as compared with the light receiving sensitivity of the photodiode unit 102. A technique is desired for suppressing the drop in the light receiving sensitivity in the photodiode separating unit (the p+ type embedded layer 104), and improving a light receiving performance of the semiconductor light receiving device.

In conjunction with the above description, Japanese Laid Open Patent Application (JP-P 2000-223735A) discloses a semiconductor light receiving device and a method of manufacturing the same. This semiconductor light receiving device includes a plurality of pairs of photodiode units and circuit units. Here, the circuit unit sequentially reads the output of the photodiode unit. This is characterized in that a part of an insulation separation band serving as the insulation separation between the photodiode unit and the circuit unit is formed as LOCOS by LOCOS oxidizing means. The part of the insulation separation band may be formed as the LOCOS by the LOCOS oxidizing means, and the other part may be composed of a P+ embedded layer. The basic structure provided with the substrate and the n+ type embedded layer or epitaxial layer may be contained on the p− type semiconductor substrate. At that time, this has a plurality of pairs of the pn-junction photodiode unit formed from the basic structure and the semiconductor element unit formed such that the collector pulling unit, the base unit and the emitter unit are sequentially added to the basic structure. The part of the insulation separation band for the insulation separation between the pn-junction photodiode unit and the semiconductor element unit is formed as the LOCOS by the LOCOS oxidizing means, and the other part is formed by the P+ embedded layer.

Japanese Laid Open Patent Application (JP-P 2002-100060A) discloses a light receiving element for a recording/reproducing device and a light receiving circuit. The light receiving element in this optical information recording/reproducing device emits a light bean to an optically recording medium and reproduces/erases a record. This is characterized in that a first light receiving unit for receiving a reflection light from the optically recording medium and reading a light beam magnitude at the time of recording and a second light receiving unit for receiving the reflection light from the optically recording medium and reading the information from the optically recording medium are divided and arranged.

Japanese Laid Open Patent Application (JP-P 2002-203954A) discloses a circuit-contained light receiving element. This circuit-contained light receiving element includes: a first-conductive semiconductor lamination structure; a photodiode for converting an input light into an electric signal through a junction with a first second-conductive semiconductor layer formed on the first-conductive semiconductor lamination structure; and a signal processing circuit which is formed in a region different from the photodiode unit in the first second-conductive semiconductor layer and processes an photoelectric converted signal. The first-conductive semiconductor lamination structure has: a first-conductive semiconductor substrate; a first first-conductive semiconductor layer, which is formed on the first-conductive semiconductor substrate and higher in impurity concentration than the first-conductive semiconductor layer; and a second first-conductive semiconductor layer, which is formed on the first-conductive semiconductor layer and lower in impurity concentration than the first first-conductive semiconductor layer. The photodiode is formed in the region surrounded with: a third first-conductive semiconductor layer formed so as to be in substantial contact with the surface of the first first-conductive semiconductor layer; and a fourth first-conductor semiconductor layer formed so as to reach the third first-conductive semiconductor layer from the surface of the first second-conductive semiconductor layer. The signal processing circuit at least includes a transistor of MOS structure.

Japanese Laid Open Patent Application (JP-A-Heisei, 09-283787) discloses a light semiconductor integrated circuit. In this light semiconductor integrated circuit, semiconductor layers of two layers are laminated on the semiconductor substrate, and at least two optical elements are assembled into the semiconductor layer. The portion between the two optical elements is surrounded with a separation region that reaches the semiconductor layer of the second layer from the semiconductor substrate, and the separation region has: a first separation region spreading from the boundary between the semiconductor substrate and the semiconductor layer of the first layer; a second separation region spreading from the boundary between the semiconductor layer of the first layer and the semiconductor layer of the second layer; and a third separation region spreading to the lower layer from the surface of the semiconductor layer of the second layer. In the semiconductor layer of the second layer, the upward diffusion length in the second separation region is set so as to exceed the half of the layer thickness of the semiconductor layer of this second layer. The third separation region overlaps with the tip of the second separation region.

SUMMARY OF THE INVENTION

In order to achieve an aspect of the present invention, the present invention provides an object of the present invention to provide a semiconductor light receiving device that can improve a light receiving performance and a method of manufacturing the same.

Another object of the present invention is to provide a semiconductor light receiving device that can suppress a drop in a light receiving sensitivity in a region where a photodiode is divided, and a method of manufacturing the same.

Still another object of the present invention is to provide a semiconductor light receiving device that can suppress a drop in a light receiving sensitivity of a blue-violet laser light in a region where a photodiode is divided.

In order to achieve an aspect of the present invention, the present invention provides a semiconductor light receiving device including: a plurality of photodiode units, each of which is configured to convert a received light into an electric signal; and a separating unit configured to electrically separates the plurality of photodiode units from each other. The impurity concentration of a surface portion of the separating unit is equal to or lower than a first concentration. The first concentration is a concentration at which the light receiving sensitivity of the separating unit to light is substantially equal to the light receiving sensitivity of each of the plurality of photodiode units of the light. A wavelength of the light is equal to or longer than that of blue-violet light.

In the present invention, since the impurity concentration of the surface portion of the separating unit is equal to or lower than a first concentration, it is possible to suppress the drop in the light receiving sensitivity even when blue-violet light is emitted. Therefore, the light receiving sensitivity is substantially constant in the semiconductor light receiving device regardless of where the light is emitted.

In the semiconductor light receiving device, the each photodiode unit may include: a first semiconductor layer configured to be common in the plurality of photodiode units and have a first conductivity type, and a second semiconductor layer configured to be connected to the first semiconductor layer and have a second conductivity type different from the first conductivity type. The separating unit may include: a third semiconductor layer configured to penetrate to the first semiconductor layer from the surface portion and have the first conductivity type. The impurity concentration of the first conductivity type of the surface portion of the third semiconductor layer is equal to or lower than the first concentration.

In the semiconductor light receiving device, the second semiconductor layer may include: a fourth semiconductor layer configured to be formed in a light receiving side of the second semiconductor layer and have the second conductivity type.

In the semiconductor light receiving device, the impurity concentration of the second conductivity type of the second semiconductor layer may be lower than the impurity concentration of the first conductivity type of the third semiconductor layer.

In the semiconductor light receiving device, a maximum of the impurity concentration of the first conductivity type of the third semiconductor layer may be at a position deeper than the surface portion.

In the semiconductor light receiving device, the third semiconductor layer may include: a first inside layer configured to be extend to the first semiconductor layer and have the first conductivity type, a second inside layer configured to be formed on the first inside layer and have the first conductivity type, and a third inside layer configured to be formed on the second inside layer, include the surface portion and have the first conductivity type.

In the semiconductor light receiving device, the maximum of the impurity concentration may be at a position in one of the first inside layer and the second inside layer.

The semiconductor light receiving device may further include: a circuit unit configured to receive output signals of the plurality of photodiode units and executes a signal processing.

In order to achieve another aspect of the present invention, the present invention provides a semiconductor light receiving device including: a semiconductor substrate configured to have a first conductivity type; a deposition layer configured to be formed on the semiconductor substrate and have a second conductivity type; a plurality of first embedded layers configured to be formed in a plurality of region adjacent to each other on a surface of the deposition layer and have the second conductivity type; and a second embedded layer configured to electrically separate the deposition layer of the plurality of the region into each other, extend from a surface of the deposition layer to the semiconductor substrate and have the first conductivity type. The impurity concentration of a surface portion of the second embedded layer is equal to or lower than a first concentration. The first concentration is a concentration at which the light receiving sensitivity of the second embedded layer to light is substantially equal to the light receiving sensitivity of each of the plurality of photodiode units to the light. A wavelength of the light is equal to or longer than that of blue-violet light.

In the semiconductor light receiving device, the impurity concentration of the second conductivity type of the deposition layer may be lower than the impurity concentration of the first conductivity type of the second embedded layer.

In the semiconductor light receiving device, a maximum of the impurity concentration of the first conductivity type of the second embedded layer may be at a position deeper than the surface portion.

In the semiconductor light receiving device, the second embedded layer may include: a first inside layer configured to be extend to the semiconductor substrate and have the first conductivity type, a second inside layer configured to be formed on the first inside layer and have the first conductivity type, and a third inside layer configured to be formed on the second inside layer, include the surface portion and have the first conductivity type.

In the semiconductor light receiving device, the maximum of the impurity concentration may be at a position in one of the first inside layer and the second inside layer.

The semiconductor light receiving device may further include: a circuit unit configured to receive output signals from the deposition layer and the first embedded layer and executes a signal processing.

In order to achieve still another aspect of the present invention, the present invention provides method of manufacturing a semiconductor light receiving device, including: (a) forming a embedded layer, which has the impurity concentration of a first conductivity type higher than the impurity concentration of the first conductivity type of a first semiconductor layer, on a predetermined position of the first semiconductor layer with the first conductivity type; (b) forming a second semiconductor layer with the second conductivity type to cover the first semiconductor layer and the embedded layer; (c) implanting ions including impurities of the first conductivity type into the second semiconductor layer above the embedded layer so as to form a first ion implantation layer whose impurity concentration of the first conductivity type in a surface of the second semiconductor layer is equal to or lower than an a first concentration; and (d) executing an thermal processing so as to form a separating unit in which the embedded layer is connected to the first ion implantation layer. The impurity concentration of a surface portion of the second semiconductor layer is equal to or lower than a first concentration. The first concentration is a concentration at which the light receiving sensitivity of the separating unit to light is substantially equal to the light receiving sensitivity of a surface of the second semiconductor layer.

In the method of manufacturing a semiconductor light receiving device, the step (c) may include: (c1) implanting ions including impurities of the second conductivity type into surface of a photodiode region so as to form a second ion implantation layer whose impurity concentration of the second conductivity type is higher than the impurity concentration of the second conductivity type of the second semiconductor layer. The photodiode region may be in the second semiconductor layer excluding a region for the first ion implantation layer.

In the method of manufacturing a semiconductor light receiving device, the step (c) may include: (c2) implanting ions including impurities of the first conductivity type into a surface of the first ion implantation layer so as to form a third ion implantation layer with the first conductivity type. The impurity concentration of the first conductivity type in a surface of the third ion implantation layer may be equal to or lower than a first concentration.

In the method of manufacturing a semiconductor light receiving device, the step (c) may include: (c3) diffusing the impurities of the first conductivity type into the first ion implantation layer such that a diffusion layer with the first conductivity type is formed in a surface of the first ion implantation layer. The impurity concentration of the first conductivity type in a surface of the diffusion layer may be equal to or lower than the first concentration.

In the method of manufacturing a semiconductor light receiving device, a maximum of the impurity concentration of the first conductivity type of the separating unit may be at a position deeper than a surface.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiments of a semiconductor light receiving device of the present invention and a method of manufacturing the same will be described below with reference to the attached drawings.

Figure 4:
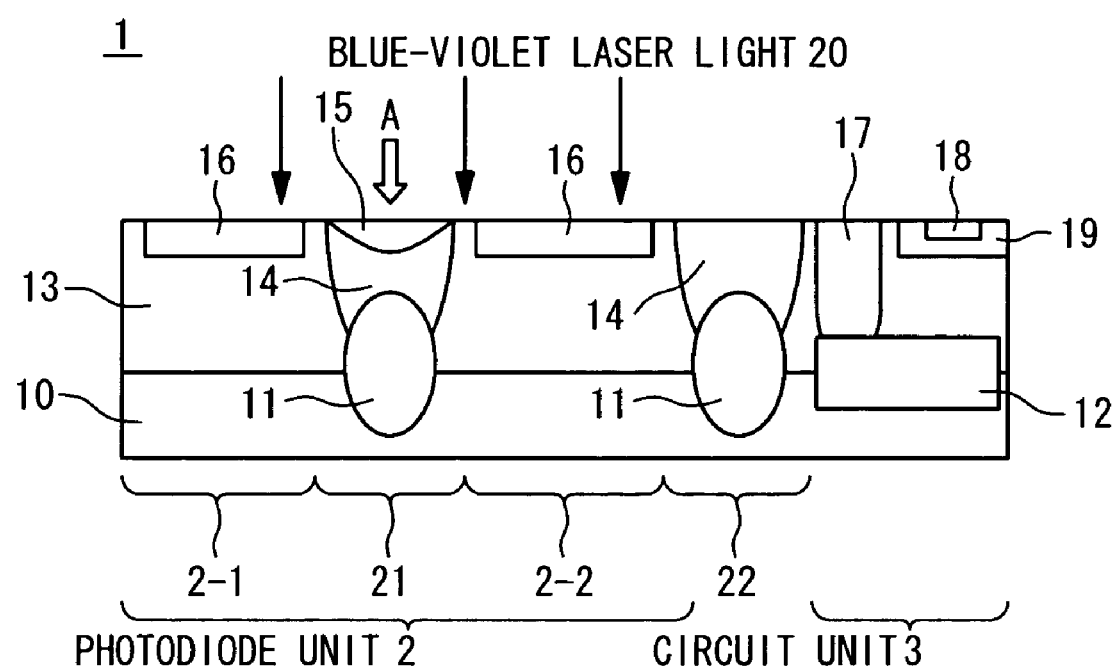
FIG. 4 is a sectional view showing a configuration in an embodiment of a semiconductor light receiving device of the present invention.

At first, the configuration of the embodiment of the semiconductor light receiving device of the present invention will be explained with reference to the attached drawings. FIG. 4 is a sectional view showing the configuration of the semiconductor light receiving device of the present invention.

A semiconductor light receiving device 1 includes a photodiode unit 2, a circuit unit 3, a separating unit 21 and a separating unit 22.

The photodiode unit 2 includes a plurality of photodiode units 2-1 to 2-n (n is a natural number and the number of the photodiode units). Each of the plurality of photodiode units 2-1 to 2-n converts a received light (for example, a blue-violet laser light 20) into an electric signal and outputs. Each of the plurality of photodiode units 2-1 to 2-n includes the pn-junction configured of a p– type semiconductor substrate 10 as a p-layer and an n type epitaxial layer 13 as an n-layer. That is, the p– type semiconductor substrate 10 is common in the plurality of photodiode units 2-1 to 2-n. The surface (light receiving surface) of the n type epitaxial layer 13 includes a plurality of n+ type diffusion layers 16 as low resistance regions.

The separating unit 21 electrically separates the plurality of photodiode units 2-1 to 2-n from each other. The separating unit 21 includes a p+ type embedding layer 11, a p– type ion implantation layer 14 and a p type ion implantation layer 15. A p type impurity concentration of the separating unit 21 is higher than an n type impurity concentration of the n type epitaxial layer 13. The p type impurity concentration of the surface portion of the separating unit 21 is lower than a predetermined first concentration. Here, the first concentration is the concentration at which the light receiving sensitivity of the separating unit 21 to light is substantially equal to that of each of the plurality of photodiode units 2-1 to 2-n. A wavelength of the light is equal to or longer than that of blue-violet light. Here, the wavelength of the blue-violet light is in the range from 400 nm to 450 nm. The substantial equality implies that the difference between both of them is within the range from –10% to +10% and preferably within the range from –5% to +5%.

In other words, the first concentration is the low concentration that the recombination in the carriers generated on the surface portion by the received light is almost null and the drop in the light receiving sensitivity can be suppressed (within the range from +10% to –10%, preferably from –5% to +5%). In this case, the surface portion is the depth range approximately similar to the optical-absorption length of the received light.

For example, in the case of the blue-violet laser light 20 whose oscillation wavelength (λ: 405 nm) is relatively short, the optical-absorption length of the light is about 0.1 μm. Thus, the surface portion is within the range from 0 μm to about 0.1 μm in depth. The predetermined value is the low concentration that the recombination in the carriers generated within the range from 0 μm to about 0.1 μm in depth by the received light is almost null and the drop in the light receiving sensitivity can be suppressed. For example, the upper limit of the concentration n0 of the p type impurity of the "p– type" is preferred to be $n0 \leq 5 \times 10^{16}/cm^3$. The lower limit of the concentration n0 is preferred to be equal to or higher than the concentration of the n type impurity of the "n– type" of the n type epitaxial layer 13.

The similar idea can be applied to even the laser light whose oscillation wavelength is shorter than the blue-violet laser light 20. In that case, the upper limit of the concentration n0 of the p type impurity of the "p– type" is further reduced. The lower limit of the concentration n0 is equal to or higher than the concentration of the n type impurity of the "n– type" of the n type epitaxial layer 13.

The separating unit 22 is similar to the separating unit 21 except that there is not the p type ion implantation layer 15.

The circuit unit 3 indicates the part thereof. The circuit unit 3 receives output signals of the photodiode unit 2 and executes a signal processing. The circuit unit 3 includes an npn type transistor. The npn type transistor includes: an n+ type embedding layer 12, a collector pulling unit 17, an emitter unit 19 and a base unit 18. The n+ type embedding layer 12 is formed on the p– type semiconductor substrate 10. The collector pulling unit 17 penetrates to the n+ type embedding layer 12 from the surface through the n type epitaxial layer 13. The emitter unit 19 is formed on the surface of the n type epitaxial layer 13. The base unit 18 is formed in the emitter unit 19.

That is, the semiconductor light receiving device 1 includes: the p– type semiconductor substrate 10; the n type epitaxial layer 13; a plurality of n+ type diffusion layers 16; and the separating unit 21. Here, the n type epitaxial layer 13 is formed on the p– type semiconductor substrate 10. The plurality of the n+ type diffusion layers 16 is formed in the plurality of regions adjacent to each other on the surface of the n type epitaxial layer 13. The separating unit 21 electrically separates the n type epitaxial layers 13 into the plurality of regions, extends to the p– type semiconductor substrate 10 from the surface of the n type epitaxial layer 13, and has the p+ type embedding layer 11, the p– type ion implantation layer 14 and the p type ion implantation layer 15. Then, the p type impurity concentration on the surface portion of the p type ion implantation layer 15 is lower than the predetermined value and lower than the inner impurity concentration.

The embodiment of a method of manufacturing the semiconductor light receiving device of the present invention will be described below with reference to the attached drawings. FIGS. 5A to 5C and 6A to 6C are sectional views showing the embodiment of the method of manufacturing the semiconductor light receiving device of the present invention.

Figure 5A:
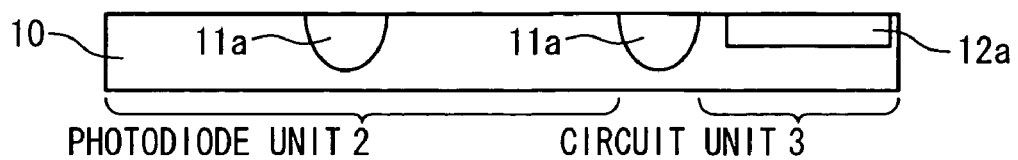
FIGS. 5A to 5C are sectional views showing an embodiment of a method of manufacturing the semiconductor light receiving device of the present invention.
Figure 5B:
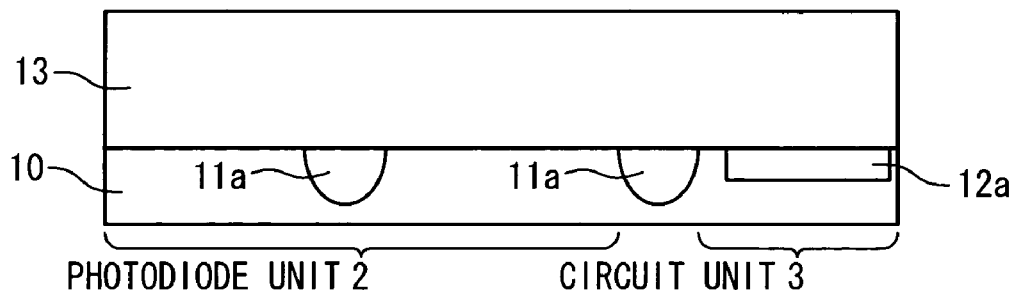
Figure 5C:
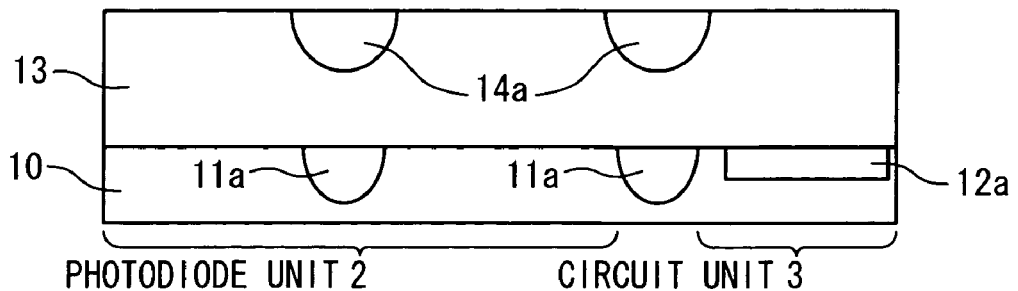

With reference to FIG. 5A, at first, on the p– type semiconductor substrate 10, a p+ type embedding layer 11a is formed in the region where the separating units 21, 22 are scheduled to be formed. Also, on the p– type semiconductor substrate 10, an n+ type embedding layer 12a is formed in the region where the circuit unit 3 is scheduled to be formed. With reference to FIG. 5B, next, the n type epitaxial layer 13 is grown so as to cover the p– type semiconductor substrate 10, the p+ type embedding layer 11a and the n+ type embedding layer 12a. With reference to FIG. 5C, after that, in the region above the p+ type embedding layer 11a where the separating units 21, 22 are scheduled to be formed, ion implantation is performed at high energy (for example, 500 KeV) from the surface, and a p– type ion implantation layer 14a is formed.

Figure 6A:
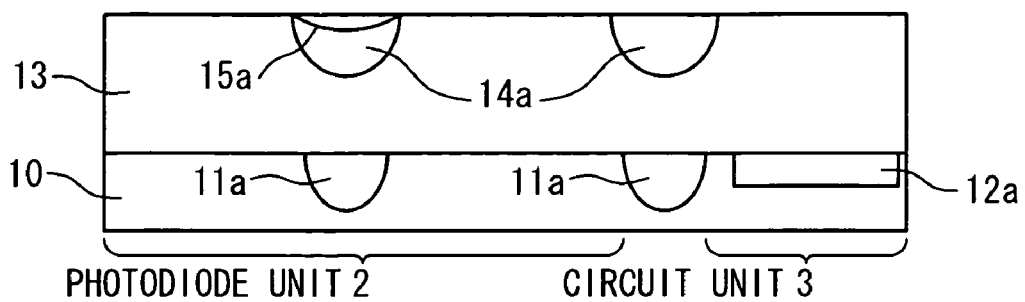
FIGS. 6A to 6C are sectional views showing an embodiment of a method of manufacturing the semiconductor light receiving device of the present invention.
Figure 6B:
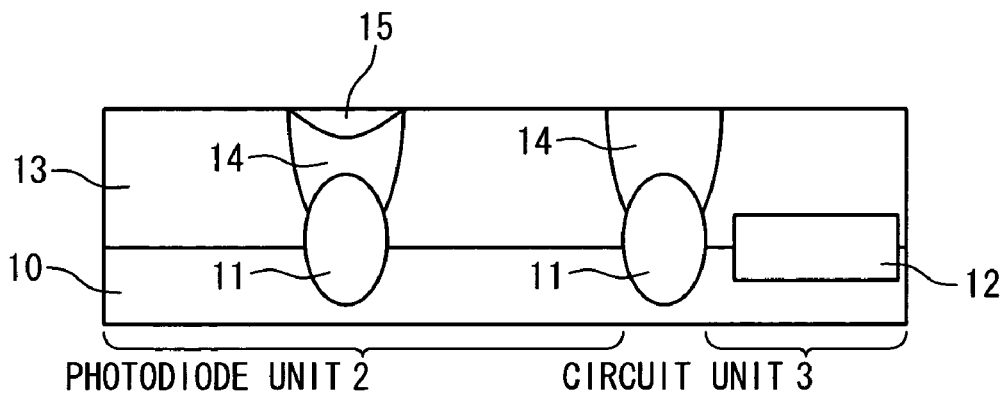
Figure 6C:
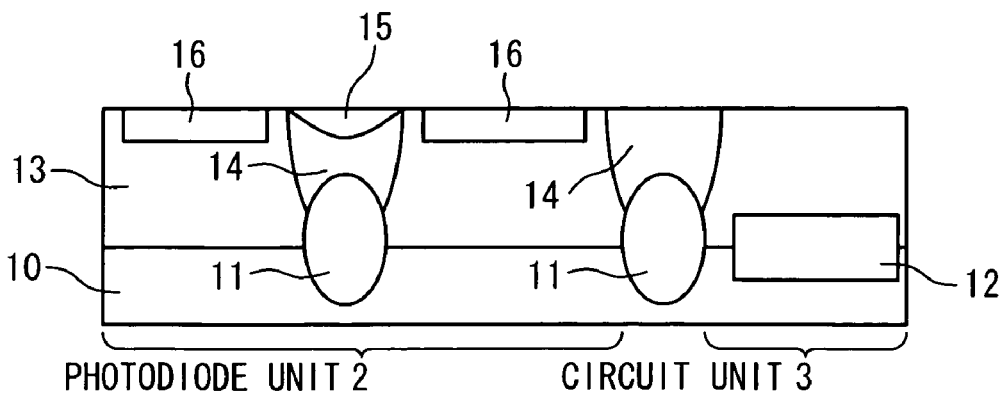

With reference to FIG. 6A, continuously, on the p– type ion implantation layer 14a where the separating unit 21 is scheduled to be formed, the ion implantation is executed at low energy, and the p type ion implantation layer 15a is formed. With reference to FIG. 6B, the thermal process is executed to mutually diffuse and activate the p type impurities in the p– type ion implantation layer 14a and the p+ type embedding layer 11a. Consequently, the p– type ion implantation layer 14a and the p+ type embedding layer 11a are connected to each other. That is, the separating units 21, 22 penetrating to the p– type semiconductor substrate 10 through the n type epitaxial layer 13 are completed. The photodiode unit 2 is electrically separated by the separating units 21. The photodiode unit 2 and the circuit unit 3 are electrically insulated and separated by the separating unit 22. Together with it, the pn-junction photodiode of the p– type semiconductor substrate 10 and the n type epitaxial layer 13 is formed. With reference to FIG. 6C, the n+ type diffusion layer 16 is formed on the surface of the n type epitaxial layer 13, and the low resistance region is reserved. After that, the collector pulling unit 17, the base unit 18 and the emitter unit 19 in the circuit unit 3 are sequentially formed by the ion implantation and the thermal process, and the semiconductor light receiving device 1 shown in FIG. 4 is completed.

Incidentally, the p+ type embedding layer 11, the n+ type embedding layer 12, the p– type ion implantation layer 14, the p type ion implantation layer 15, the n+ type diffusion layer 16, the collector pulling unit 17, the base unit 18 and the emitter unit 19 are all formed by the ion implantation. However, except the p– type ion implantation layer 14, they can be formed by the diffusion method. Also, the p– type ion implantation layer 14 may penetrate up to the p+ type embedding layer 11 at the stage of the ion implantation.

Figure 7:
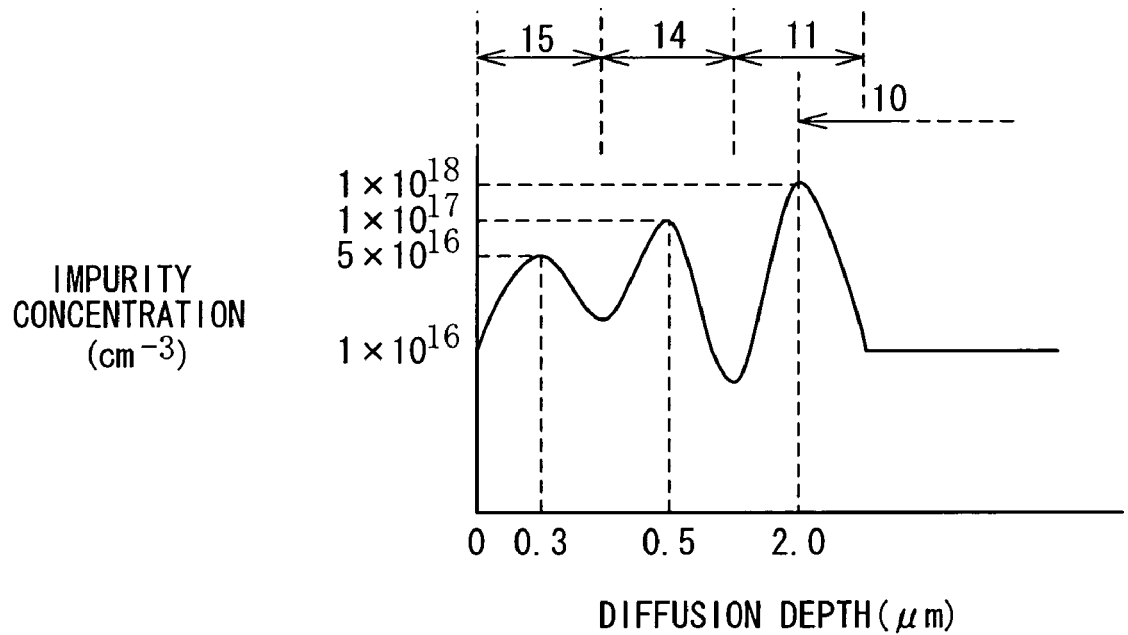
FIG. 7 is a graph showing one example of a concentration profile in a depth direction of a p type impurity in a division portion.

FIG. 7 is a graph showing a example of the concentration profile in the depth direction of the p type impurity in the separating unit 21 (the position of an arrow A of FIG. 4). The longitudinal axis shows the impurity concentration, and the lateral axis shows the diffusion depth, respectively. Here, although the numbers in the graph of FIG. 7 indicates the numbers of each layer in FIG. 4, they are examples and are not limited to them. With reference to FIG. 7, the maximum value ($1\times10^{17}/cm^3$) of the impurity concentration in the separating unit 21 is not in the surface vicinity. The maximum value lies in the depth of about 0.5 µm. That is, the surface concentration is kept at low level (for example, $1\times10^{16}/cm^3$) of the separating unit 21. Thus, when the blue-violet laser light 20 whose oscillation wavelength (λ: 405 nm) is low is emitted to the surface of the photodiode unit 2, especially, to the separating unit 21 (the p– type ion implantation layer 14 and the p type ion implantation layer 15), although the optical-absorption length of the light is shallow such as 0.1 µm, the recombination of the carriers generated in the surface vicinity is almost null, which can reduce the drop in the light receiving sensitivity.

Figure 8:
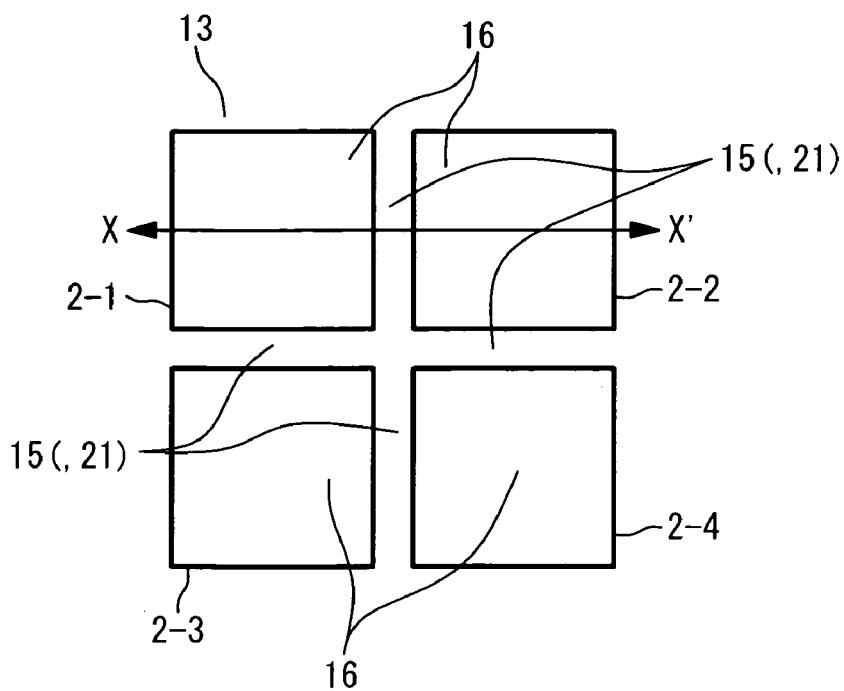
FIG. 8 is a schematic top view showing a part of the semiconductor light receiving device of the present invention.

FIG. 8 is a schematic top view showing a part of the semiconductor light receiving device of the present invention. A plurality of diode units 2-1 to 2-4 schematically indicated in the n+ type diffusion layer 16 are electrically separated by the p type ion implantation layer 15 of the separating unit 21.

Figure 1:
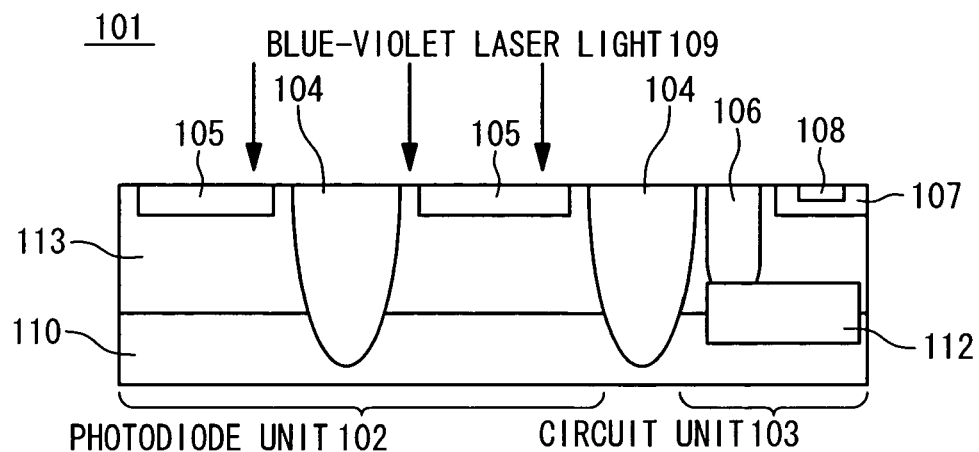
FIG. 1 is a sectional view showing a configuration of a conventional semiconductor light receiving device.
Figure 2:
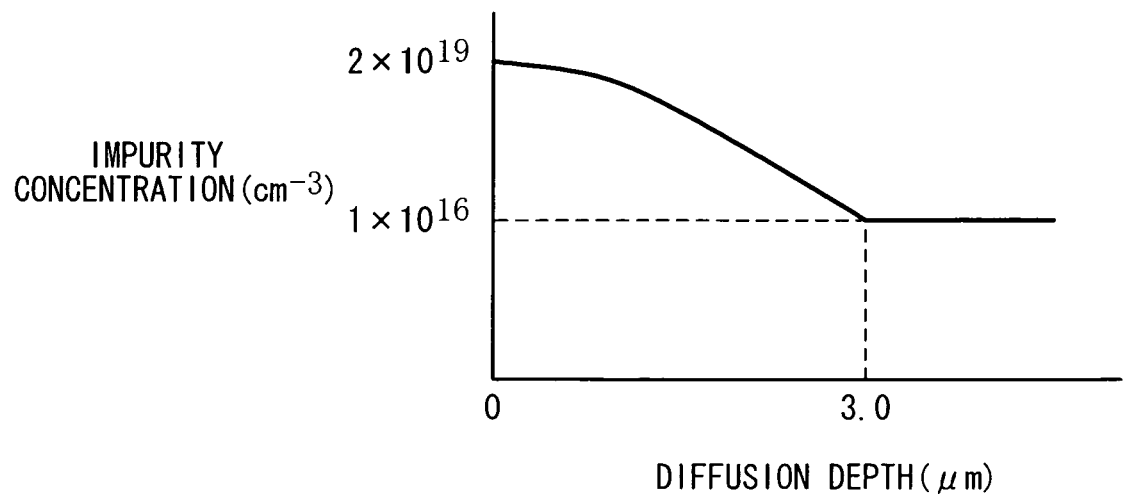
FIG. 2 is a graph showing a concentration profile in a depth direction in a photodiode separating unit of the semiconductor light receiving device.
Figure 3:
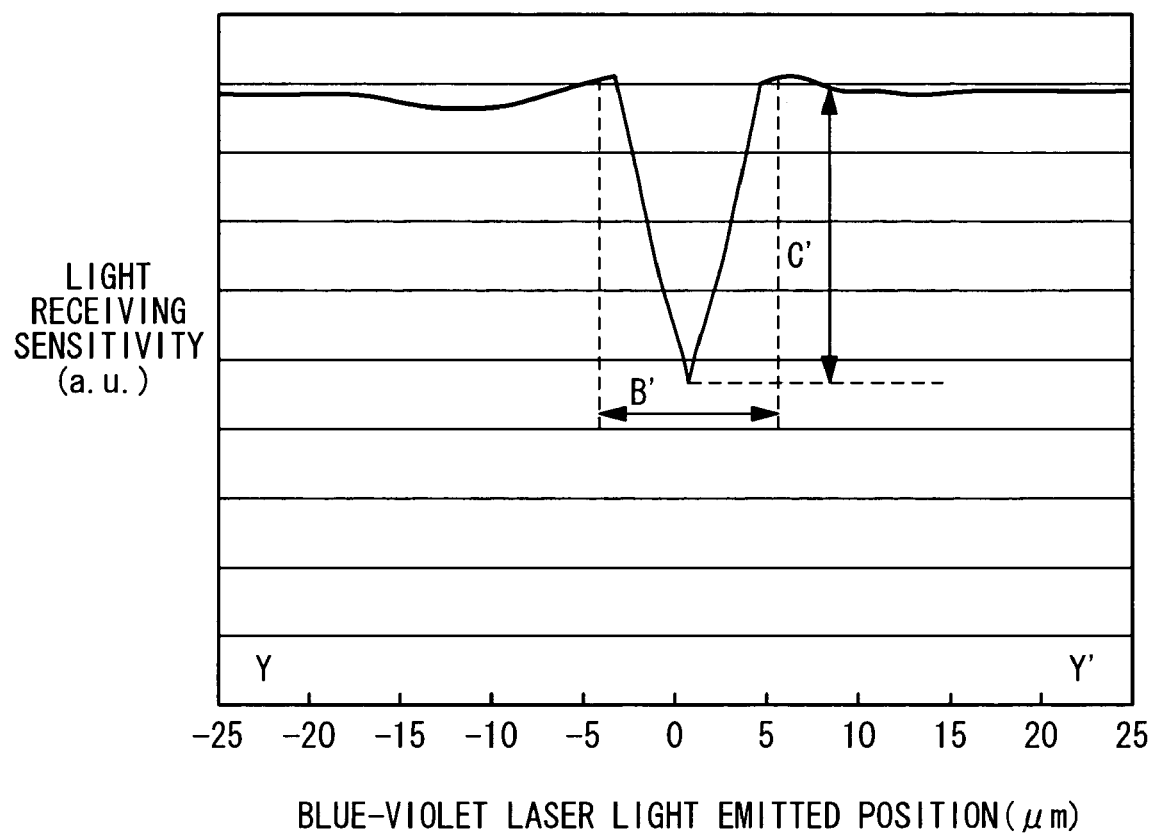
FIG. 3 is a graph showing a light receiving sensitivity in vicinity of a photodiode separating unit.
Figure 9:
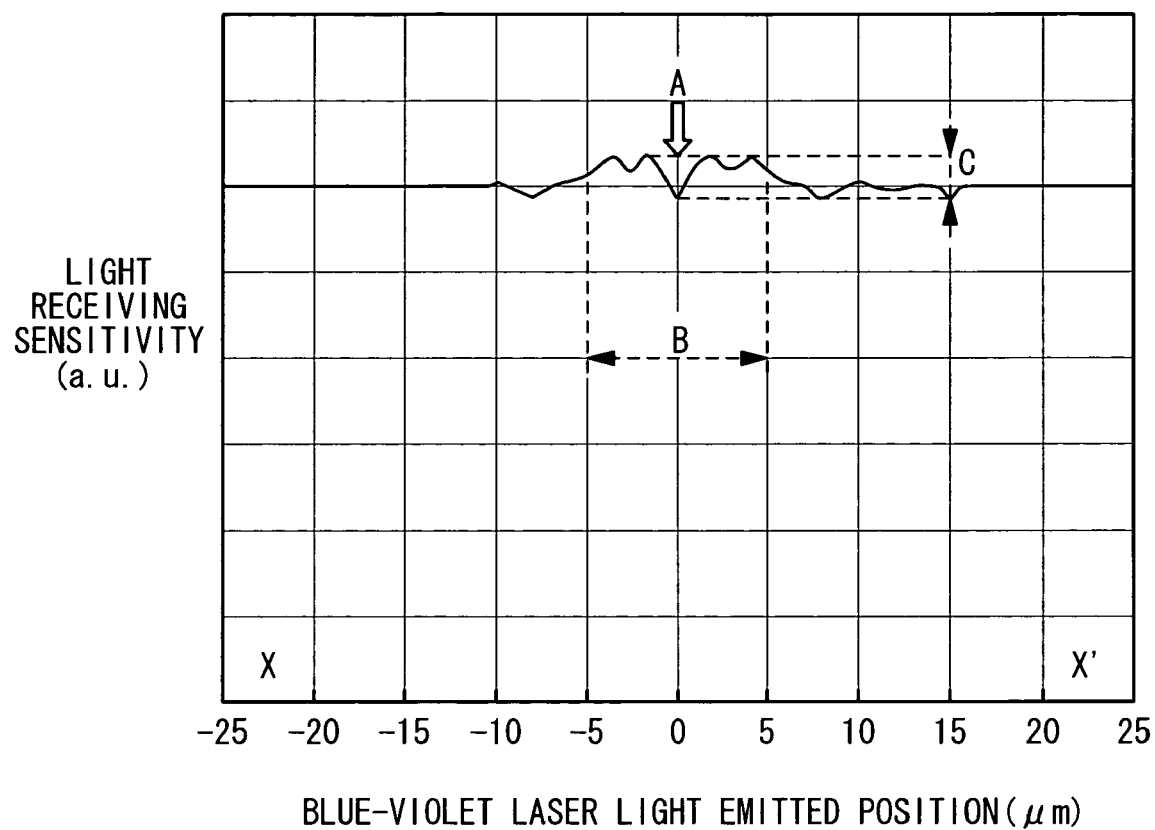
FIG. 9 is a graph showing a light receiving sensitivity property simulation result obtained when a blue-violet laser light is emitted to XX' of FIG. 5.

FIG. 9 is a graph showing a simulation result of the light receiving sensitivity property obtained when the blue-violet laser light 20 is emitted towards the position of XX' in FIG. 8. The longitudinal axis shows the light receiving sensitivity (arbitrary unit). The lateral axis shows a position where blue-violet laser light is emitted (the blue-violet laser light emitted position). Here, the position of the separating unit 21 is the center position (0 µm). An arrow A indicates the arrow A in FIG. 1. The range indicated by B indicates the light receiving sensitivity of the separating unit 21, when the blue-violet laser light 20 is emitted as shown by the arrow A of the blue-violet laser light 20 in FIG. 4. That is, in the separating unit 21, it is known that there is the change in the light receiving sensitivity of the magnitude indicated by a difference C. However, the difference C falls within the range from –5% to 5%, as compared with the light receiving sensitivity of the different photodiode unit 2. Thus, there is no problem.

According to the present invention, even when the blue-violet laser light is emitted, the light receiving sensitivity is constant independently of the receiving position. That is, the light receiving sensitivity can be substantially equal between the case of emitting the light to the region where the separating unit 21 exists and the case of emitting the light to the region where the separating unit 21 does not exist.

Figure 10:
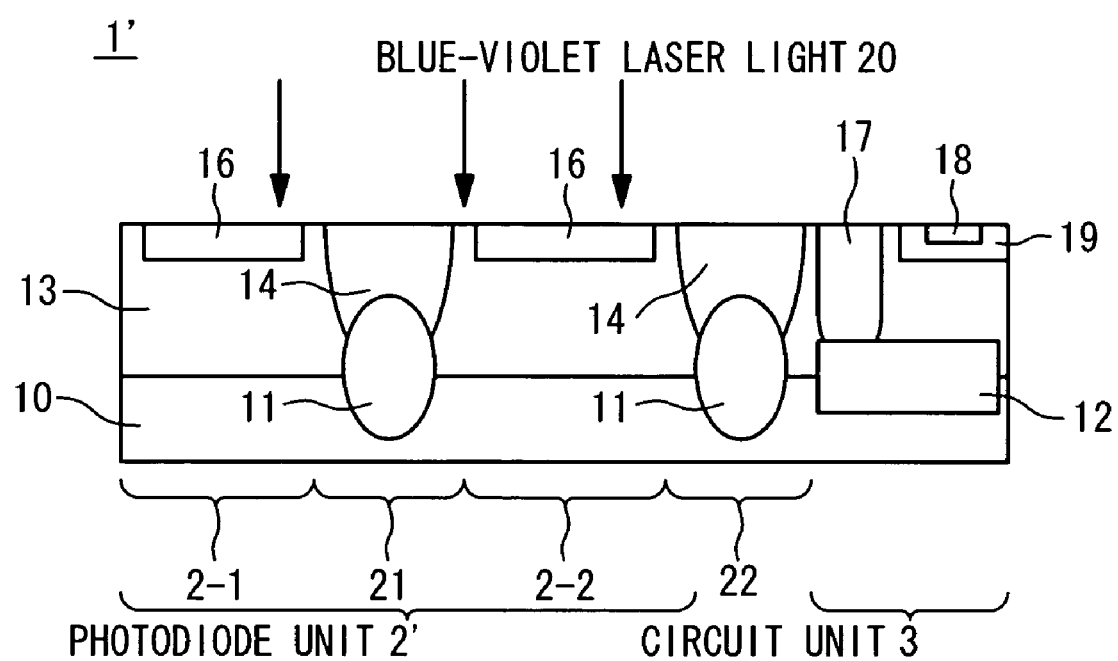
FIG. 10 is a sectional view showing another configuration in the embodiment in the semiconductor light receiving device of the present invention.

In the semiconductor light receiving device 1 in FIG. 4, the p type ion implantation layer 15 may not be installed, which is shown in FIG. 10. FIG. 10 is a sectional view showing another configuration of the semiconductor light receiving device of the present invention. This semiconductor light receiving device 1' differs from the semiconductor light receiving device 1 shown in FIG. 4 in that the p type ion implantation layer 15 is not used. Even if the p type ion implantation layer 15 is not formed, the performance and effect equal to the case of FIG. 4 can be obtained. However, in the case of FIG. 10, when the ion implantation is executed, the dose amount of the ions and the profile are set such that the concentration on the surface of the p– type ion implantation layer 14 is not the lower concentration than the n type epitaxial layer 13. The manufacturing method is similar to the case of FIG. 4 except that there is not the ion implantation step with regard to FIG. 6A.

In the case of FIG. 10, the p type ion implantation layer 15 is not formed, which can reduce the lead time of the ion implantation step and the diffusion step. In addition, since the structure becomes simple, the manufacturing yield can be improved.

According to the present invention, it is possible to suppress the drop in the light receiving sensitivity in the region where the photodiode in the semiconductor light receiving device is separated.

It is apparent that the present invention is not limited to the above embodiment, that may be modified and changed without departing form the scope and spirit of the invention.

What is claimed is:

1. A semiconductor light receiving device comprising:
   a plurality of photodiode units, each of which is configured to convert a received light into an electric signal; and
   a separating unit configured to electrically separate an adjacent pair of said plurality of photodiode units from each other, said separating unit having a light-receiving surface portion with no more than a first concentration of an impurity, and an embedded portion beneath the surface portion having a second concentration of the impurity higher than the first concentration, said separating unit not having an electrode that blocks received light,
   wherein each of said photodiode units includes,
   a first semiconductor layer common among said plurality of photodiode units and having a first conductivity type, and
   a second semiconductor layer connected to said first semiconductor layer and having a second conductivity type different from said first conductivity type,
   wherein said embedded portion penetrates to said first semiconductor layer and has said first conductivity type, and
   wherein said second semiconductor layer includes a diffused portion of said second conductivity type in a light receiving side of said second semiconductor layer and having a higher impurity concentration than a remainder of said second semiconductor layer.

2. The semiconductor light receiving device according to claim 1, wherein the impurity concentration of said second conductivity type of said second semiconductor layer is lower than the impurity concentration of said first conductivity type of said embedded layer.

3. The semiconductor light receiving device according to claim 1, wherein a maximum of the impurity concentration of said first conductivity type of said embedded layer is at a position deeper than said surface portion.

4. The semiconductor light receiving device according to claim 1, further comprising:
   a circuit unit configured to receive output signals of said plurality of photodiode units and executes a signal processing.

5. The semiconductor light receiving device of claim 1, wherein said first concentration is a concentration at which a blue-violet light receiving sensitivity of said surface portion of said separating unit is substantially equal to a blue-violet light receiving sensitivity of each of said plurality of photodiode units.

6. The semiconductor light receiving device according to claim 5, wherein said embedded layer includes:
   a first inside layer configured to be extend to said first semiconductor layer and have said first conductivity type,
   a second inside layer configured to be formed on said first inside layer and have said first conductivity type, and
   a third inside layer configured to be formed on said second inside layer, include said surface portion and have said first conductivity type.

7. The semiconductor light receiving device according to claim 6, wherein said maximum of the impurity concentration is at a position in one of said first inside layer and said second inside layer.

8. A semiconductor light receiving device comprising:
   a plurality of photodiode units, each of which is configured to convert light into an electric signal, each of said photodiode units including a lower layer of a first conductivity type and an upper layer of a second conductivity type; and
   a separating unit configured to electrically separate an adjacent pair of said plurality of photodiode units from each other, said separating unit having a light-receiving surface portion with no more than a first peak concentration of an impurity of the first conductivity type, a first implanted portion connected to and beneath the surface portion with a second peak concentration of the impurity lower than the first concentration, and a second implanted portion connected to and beneath the first implanted portion with a third peak concentration of the impurity higher than the first concentration, the first, second and third peak concentrations being separated by portions with concentrations of the impurity lower than the first concentration, said second implanted portion being in both said upper and lower layers, said separating unit not having an electrode that blocks received light.

9. The semiconductor light receiving device of claim 8, wherein said first concentration is a concentration at which a blue-violet light receiving sensitivity of said surface portion of said separating unit is substantially equal to a blue-violet light receiving sensitivity of each of said plurality of photodiode units.

* * * * *